(12) United States Patent
Kinyua (10) Patent No.: US 9,900,023 B1
(45) Date of Patent: Feb. 20, 2018

(54) MULTI-STAGE DELTA-SIGMA PIPELINED SUCCESSIVE APPROXIMATION REGISTER ANALOG-TO-DIGITAL CONVERTER

(71) Applicant: TAIWAN SEMICONDUCTOR MANUFACTURING CO., LTD., Hsinchu (TW)

(72) Inventor: Martin Kinyua, Cedar Park, TX (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/407,201

(22) Filed: Jan. 16, 2017

Related U.S. Application Data (60) Provisional application No. 62/426,646, filed on Nov. 28, 2016.

(51) Int. Cl.
| | | |
|---|---|---|
| *H03M 1/00* | (2006.01) | |
| *H03M 3/00* | (2006.01) | |
| *H03M 1/38* | (2006.01) | |
| *H03M 1/36* | (2006.01) | |
| *H03M 1/06* | (2006.01) | |
| *H03M 1/12* | (2006.01) | |

(52) U.S. Cl.
CPC ............ *H03M 3/464* (2013.01); *H03M 1/38* (2013.01); *H03M 3/412* (2013.01); *H03M 1/00* (2013.01); *H03M 1/0695* (2013.01); *H03M 1/12* (2013.01); *H03M 1/365* (2013.01)

(58) Field of Classification Search
CPC .......... H03M 1/00; H03M 1/12; H03M 1/365; H03M 1/0695

USPC .......................... 341/110, 161, 162, 155, 159
See application file for complete search history.

(56) References Cited

U.S. PATENT DOCUMENTS

| | | | | |
|---|---|---|---|---|
| 8,421,660 B1 * | 4/2013 | Wan | ................. | H03M 3/392 |
| | | | | 341/118 |
| 9,136,868 B1 * | 9/2015 | Danneels | ................. | H03M 3/46 |
| 2015/0009059 A1 * | 1/2015 | Chen | ................. | H03M 1/187 |
| | | | | 341/155 |

OTHER PUBLICATIONS

Bernhard E. Boser et al., "The Design of Sigma-Delta Modulation Analog-to-Digital Converters", IEEE JSSC, vol. 23, No. 6, pp. 1298-1308, Dec. 1988.
Jan Craninckx et al., "A 65 fJ/Conversion-Step 0-to-50 MS/s 0-to-0.7 mW 9b Charge-Sharing SAR ADC in 90nm Digital CMOS", IEEE ISSCC Digest of Technical Papers, pp. 246-247, Feb. 2007.

* cited by examiner

*Primary Examiner* — Joseph Lauture
(74) *Attorney, Agent, or Firm* — McClure, Qualey & Rodack, LLP (57) ABSTRACT

A device includes a first conversion stage, a second conversion stage, and a first filter circuit. The first conversion stage is configured to perform a Delta-Sigma modulation based on an input signal, in order to generate a first quantized signal and a first residual signal. The second conversion stage is configured to perform a pipelined successive approximation algorithm in response to the first residual signal, in order to generate a second quantized signal. The first filter circuit is configured to perform a decimation process based on the first quantized signal and the second quantized signal to generate a digital output signal.

20 Claims, 5 Drawing Sheets

MULTI-STAGE DELTA-SIGMA PIPELINED SUCCESSIVE APPROXIMATION REGISTER ANALOG-TO-DIGITAL CONVERTER

RELATED APPLICATION

This application claims priority to U.S. Provisional Application Ser. No. 62/426,646, filed Nov. 28, 2016, which is herein incorporated by reference.

BACKGROUND

Analog to digital converters (ADCs) are commonly used in a variety of electronic products, such as signal input interfaces of displays, sound cards, etc. With different applications of analog to digital converters in various electronic devices, parameters such as resolution, operating frequency, dynamic range, etc. of the ADCs determine performance of the electronic devices. However, design tradeoffs are present in the parameters of the ADCs. In practical applications, the performance of the electronic devices is usually limited by the design tradeoffs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Figure 1:
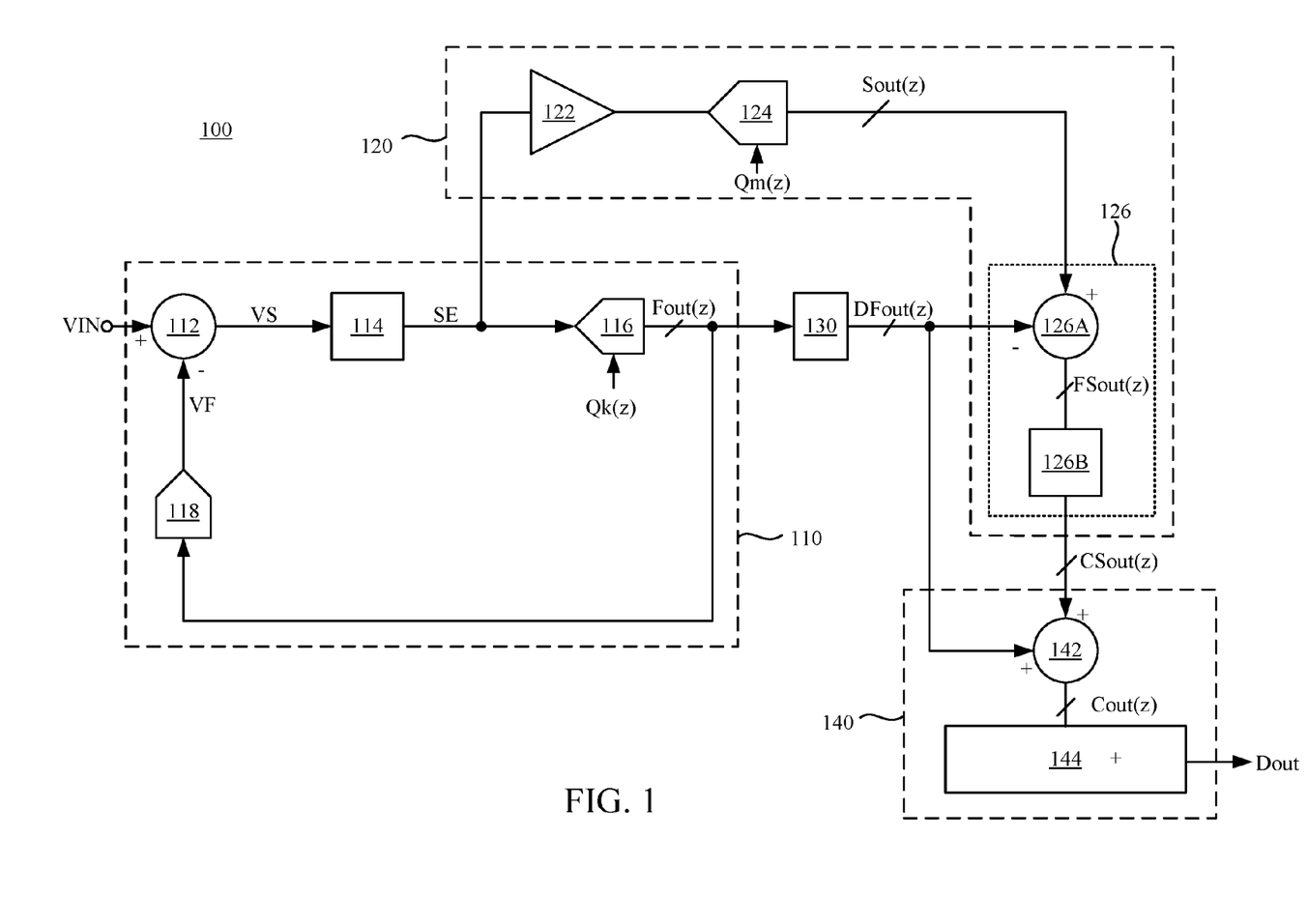
FIG. 1 is a schematic diagram of an electronic device, in accordance with some embodiments of the present disclosure.

Reference is now made to FIG. 1. FIG. 1 is a schematic diagram of an electronic device 100, in accordance with some embodiments of the present disclosure. In some embodiments, the electronic device 100 is configured to operate as a hybrid analog-to-digital converter (ADC).

The electronic device 100 includes a conversion stage 110, a conversion stage 120, a delay circuit 130, and a filter circuit 140. In some embodiments, the conversion stage 110 is configured to perform a Delta-Sigma modulation based on an input signal VIN, in order to generate a quantized signal Fout(z) and a residual signal SE. In some embodiments, the conversion stage 110 is configured to operate as a Delta-Sigma ADC. In some embodiments, the conversion stage 110 includes a calculation circuit 112, a loop filter 114, a sub-ADC 116, and a sub-digital-to-analog converter (sub-DAC) 118.

The calculation circuit 112 is configured to subtract a feedback signal VF from the input signal VIN to generate a subtracted signal VS. The subtracted signal VS indicates a difference between the input signal VIN and the feedback signal VF. In some embodiments, the calculation circuit 112 is implemented with an adder circuit. Various circuits to implement the calculation circuit 112 are within the contemplated scope of the present disclosure.

The loop filter 114 is coupled to the calculation circuit 112 to receive the subtracted signal VS. The loop filter 114 is configured to filter the subtracted signal VS to generate the residual signal SE. In some embodiments, the loop filter 114 includes one or more integrators (not shown) and/or resonant circuits (not shown). In further embodiments, the resonant circuits are configured to define a bandwidth of the loop filter 114.

The above arrangements of the loop filter 114 are given for illustrative purposes only. Various arrangements of the loop filter 114 are within the contemplated scope of the present disclosure.

The sub-ADC 116 is coupled to the loop filter 114 to receive the residual signal SE. The sub-ADC 116 is configured to convert the residual signal SE to the quantized signal Fout(z). In some embodiments, the sub-ADC 116 is implemented with various types of quantizers. For example, in some embodiments, the sub-ADC 116 is implemented with parallel comparators. In some other embodiments, the sub-ADC 116 is implemented with a successive approximation register (SAR) ADC.

The sub-DAC 118 is coupled to the sub-ADC 116 to receive the quantized signal Fout(z). The sub-DAC 118 is configured to convert the quantized signal Fout(z) to the feedback signal VF. In some embodiments, the sub-DAC 118 is implemented with switch-capacitor circuits, which include, for example, a SAR DAC. In some embodiments, the sub-DAC 118 is implemented with a current DAC, in which an output signal of the current DAC is a current signal. In some embodiments, in a condition that the sub-DAC 118 is the current DAC, the subtracted signal VS can be generated by directly coupling the feedback signal VF back to an input terminal of the loop filter 114 without the calculation circuit 112. The above arrangements of the sub-DAC 118 and the calculation circuit 112 are given for illustrative purposes only. Various arrangements of the sub-DAC 118 and the calculation circuit 112 are within the contemplated scope of the present disclosure.

The conversion stage 120 is coupled to the conversion stage 110 to receive the residual signal SE. In some embodiments, the conversion stage 120 is configured to perform an analog-to-digital conversion based on the residual signal SE, in order to generate a quantized signal Sout(z). In some embodiments, the analog-to-digital conversion of the conversion stage 120 is performed with a pipelined successive approximation algorithm. In some embodiments, the conversion stage 120 is configured to operate as a pipelined ADC.

For example, in some embodiments, the conversion stage 120 includes an amplifier 122, a pipelined ADC 124, and a filter circuit 126. The amplifier 122 is coupled to the loop filter 114 to receive the residual signal SE. The amplifier 122 is configured to provide an inter-stage gain to amplify the residual signal SE. The pipelined ADC 124 is configured to perform the analog-to-digital conversion in response to the amplified residual signal SE, in order to generate a quantized signal Sout(z). In some embodiments, the pipelined ADC 124 includes multiplying DACs (MDAC) (e.g., SAR sub-ADC 124A and amplifier 124B shown in FIG. 2 below). In some embodiments, the MDACs of the pipelined ADC 124 are implemented with successive approximation register (SAR) ADCs. The detailed operations regarding the pipelined ADC 124 are given below with reference to FIG. 2.

In some embodiments, the filter circuit 126 is configured to operate as a differentiator. For example, the filter circuit 126 includes a calculation circuit 126A and a digital filter 126B. The calculation circuit 126A is configured to subtract a delayed quantized signal DFout(z) from the quantized signal Sout(z) to generate a quantized signal FSout(z). The digital filter 126B is coupled to the calculation circuit 126A to receive the quantized signal FSout(z). The digital filter 126B is configured to perform a digital signal processing to correct the quantized signal FSout(z), in order to generate a corrected quantized signal CSout(z).

In some embodiments, the quantized signal Fout(z) has k-bits, the quantized signal Sout(z) has m-bits, and m is greater than k. The delay circuit 130 is configured to delay the quantized signal Fout(z) for a predetermined time, in order to generate the delayed quantized signal DFout(z). In some embodiments, the predetermined time are configured to be the same as a processing time of the pipelined ADC 124. Effectively, with the delay circuit 130, bits of the delayed quantized signal DFout(z) are able to be aligned with the quantized signal Sout(z) in time. In some embodiments, the delay circuit 130 is implemented with various digital circuits, which include, for example, inverters, flip-flops, or registers.

The filter circuit 140 is coupled to the delay circuit 130 to receive the delayed quantized signal DFout(z), and is coupled to the conversion stage 120 to receive the corrected quantized signal CSout(z). In some embodiments, the filter circuit 140 is configured to combine the delayed quantized signal DFout(z) with the corrected quantized signal CSout(z), and then to perform a decimation process on the combined signal to generate a digital output signal Dout.

For example, as shown in FIG. 1, the filter circuit 140 includes a calculation circuit 142 and a decimation filter 144. The calculation circuit 142 is configured to add the delayed quantized signal Fout(z) and the corrected quantized signal CSout(z), in order to generate a quantized signal Cout(z). The decimation filter 144 is coupled to the calculation circuit 142 to receive the quantized signal Cout(z). The decimation filter 144 is configured to perform the decimation process in response to the quantized signal Cout(z), in order to generate the digital output signal Dout. In some embodiments, during the decimation process, portions of the quantized signal Cout(z) are discarded to reduce the output rate of the quantized signal Cout(z). In some embodiments, the discarded portions of the quantized signal Cout(z) correspond to out-of-band signals and noises.

In some embodiments, the decimation filter 144 is implemented with various types of filters, which include, for example, finite impulse response (FIR) filters, Comb filters, Hogenauer filters, etc. The above configurations and the implementations of the decimation filter 144 are given for illustrative purposes only. Various circuits to implement the decimation filter 144 are within the contemplated scope of the present disclosure.

For a typical Delta Sigma ADC, an output thereof can be derived as a combination of a signal transfer function and a noise transfer function. Taking the conversion stage 110 as an example, the quantized signal Fout(z) can be expressed as the following equation (1):

$$\text{Fout}(z)=\text{STF}(z)\text{Vin}+\text{NTF}(z)Qk(z) \quad (1),$$

where STF(z) is a signal transfer function of the conversion stage 110, and NTF(z) is a noise transfer function of the conversion stage 110. In some embodiments, the signal transfer function STF(z) has a function similar with an all-pass filter. In some embodiments, the noise transfer function NTF(z) has a function similar with a high-pass filter.

In some embodiments, the quantized signal Sout(z) can be expressed as the following equation (2):

$$\text{Sout}(z)=Z^{-D}[\text{Fout}(z)-Qk(z)]+Qm(z) \quad (2),$$

where D is a delay time introduced from the delay circuit 130, Qk(z) is a quantization error generated during the quantization process of the sub-ADC 116 and Qm(z) is a quantization error associated with the conversion process of the conversion stage 120. In some embodiments, the quantization error Qk(z) is equal to the residual signal SE. Moreover, the quantized signal Cout(z) can be expressed as the following equation (3):

$$\text{Cout}(z)=Z^{-D}\text{Fout}(z)+Hd(z)[\text{Sout}(z)-Z^{-D}\text{Fout}(z)] \quad (3),$$

where Hd(z) is a transfer function of the digital filter 126B. By substituting the equations (1) and (2) into the equation (3), the quantized signal Cout(z) can be derived as:

$$\text{Cout}(z)=Z^{-D}\text{STF}(z)\text{Vin}+Z^{-D}[\text{NTF}(z)-Hd(z)]Qk(z)+Hd(z)Qm(z) \quad (4).$$

In some embodiments, in a condition that the transfer function Hd(z) of the digital filter 126B is designed to be the same as the noise transfer function NTF(z) of the conversion stage 110, the equation (4) becomes:

$$\text{Cout}(z)=Z^{-D}\text{STF}(z)\text{Vin}+\text{NTF}(z)Qm(z) \quad (5).$$

According to the equation (5), the quantized signal Cout(Z) is able to be derived as a combination of the signal transfer function STF(z) and a noise transfer function NTF(z). Effectively, in the condition that the transfer function Hd(z) is the same as the noise transfer function NTF(z), the electronic device 100 operates as a typical Delta Sigma ADC. As a result, with the SAR ADC circuit portion and the function derived in the equation (5), the electronic device 100 is able to have a high resolution while keeping a high bandwidth and lower power consumption.

In some approaches, a single ADC is utilized to convert an analog signal to a digital signal. However, there are design tradeoffs between a resolution and a sampling rate in the aforementioned approaches. For example, when a single Delta Sigma ADC is employed, a high resolution can be achieved while the sampling rate is limited. Alternatively, when a single SAR ADC is employed, low power operations are achieved while the resolution is limited.

As discussed above, compared with the approaches above, the electronic device 100 is configured to operate as the hybrid ADC. The hybrid ADC includes two conversion stages 110 and 120 that employ different analog-to-digital conversions. For example, the conversion stage 110 operates as a Delta-Sigma ADC that has the higher resolution. The conversion stage 120 operates as a pipelined SAR ADC that has a higher bandwidth and lower power consumption. With such the arrangements, the electronic device 100 is able to combine the advantages of both the Delta-Sigma ADC and the pipelined SAR ADC. As a result, a high resolution and a high sampling rate can be achieved.

Figure 2:
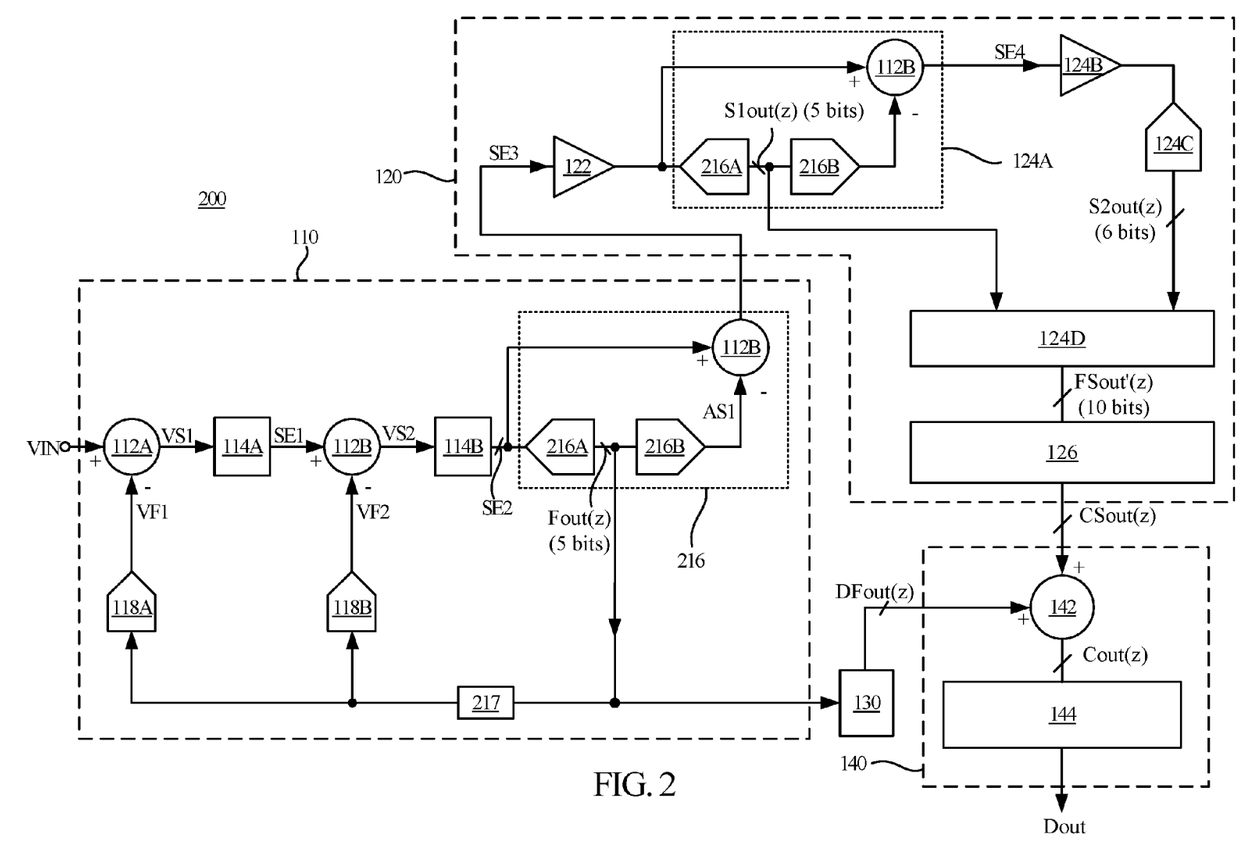
FIG. 2 is a schematic diagram of an electronic device, in accordance with some embodiments of the present disclosure.

Reference is now made to FIG. 2. FIG. 2 is a schematic diagram of an electronic device 200, in accordance with some embodiments of the present disclosure. For ease understanding, like elements in FIG. 2 are designated with the same reference numbers with respect to FIG. 1.

In the example of FIG. 2, the conversion stage 110 is implemented with a second order Delta-Sigma modulator. As shown in FIG. 2, the conversion stage 110 includes two calculation circuits 112A and 112B, two integrators 114A and 114B, a sub-ADC 216, a dynamic element matching (henceforth DEM) circuit 217, two sub-DACs 118A and 118B. The calculation circuits 112A and 112B correspond to the calculation circuit 112 in FIG. 1. The integrators 114A and 114B correspond to the loop filter 114 in FIG. 1. The sub-DACs 118A and 118B correspond to the sub-DAC 118 in FIG. 1.

The calculation circuit 112A is configured to subtract a feedback signal VF1 from the input signal VIN to generate a subtracted signal VS1. The integrator 114A is coupled between the calculation circuits 112A and 112B. The integrator 114A is configured to filter noises on the subtracted signal VS1 to generate a residual signal SE1. The calculation circuit 112B is configured to subtract a feedback signal VF2 from residual signal SE1 to generate a subtracted signal VS2. The integrator 114B is coupled between the calculation circuit 112B and the sub-ADC 216. The integrator 114B is configured to filter noises on the subtracted signal VS2 to generate a residual signal SE2.

In some embodiments, the integrators 114A and 114B are configured to have a single clock cycle delay. In some embodiments, the sub-DAC 118B is also configured to have a single clock cycle delay. With such the arrangements, in some situations, an excess loop delay in the conversion stage 110 can be compensated. In some embodiments, the integrator 114A is configured to have a unity gain. With the arrangement of the unity gain, the integrator 114A is able to reduce more errors introduced from the sub-DAC 118B and the integrator 114B.

The configurations of the integrators 114A and 114B are given for illustrative purposes only. Various configurations of the integrators 114A and 114B are within the contemplated scope of the present disclosure.

In some embodiments, the sub-ADC 216 includes an ADC 216A, a DAC 216B, and a calculation circuit 216C. In some embodiments, the sub-ADC 216 is implemented with a SAR ADC. The sub-ADC 216 corresponds to the sub-ADC 116 in FIG. 1. The ADC 216A is coupled to the integrator 114B to receive the residual signal SE2. The ADC 216A is configured to convert the residual signal SE2 to the quantized signal Fout(z). The DAC 216B is coupled to the ADC 216A to receive the quantized signal Fout(z). The DAC 216B is configured to convert the quantized signal Fout(z) to an analog signal AS1. The calculation circuit 216C is configured to subtract the analog signal AS1 from the residual signal SE2 to generate a residual signal SE3.

The DEM circuit 217 is coupled to the ADC 216A to receive the quantized signal Fout(z). In some embodiments, the DEM circuit 217 is configured to, based on the quantized signal Fout(z), dynamically rearrange interconnections of components in the integrators 114A and 114B and/or the sub-DACs 118A and 118B. With the DEM circuit 217, the effects of components mismatches in the integrators 114A and 114B and/or the sub-DACs 118A and 118B are reduced, and the performance of those circuits can be improved. An exemplary embodiment to implement the DEM circuit 217 with the integrators 114A and 114B will be given with reference to FIG. 3 below.

The sub-DACs 118A and 118B are coupled to the DEM circuit 217 to receive the quantized signal Fout(z). The sub-DAC 118A is configured to convert the quantized signal Fout(z) to the feedback signal VF1. The sub-DAC 118B is configured to convert the quantized signal Fout(z) to the feedback signal VF2. As described above, in some embodiments, the sub-DAC 118B is configured to have the single clock cycle delay. In other words, the quantized signal Fout(z) processed by the sub-DAC 118A is earlier than the quantized signal Fout(z) processed by the sub-DAC 118B by the single clock cycle.

Furthermore, the conversion stage 120 in FIG. 2 includes an amplifier 122, a SAR sub-ADC 124A, an amplifier 124B, a SAR sub-ADC 124C, a correction logic circuit 124D, and a differentiator 126. The amplifier 122 is coupled to the sub-ADC 216 to amplify the residual signal SE3. In some embodiments, the gain of the amplifier 122 is associated with the resolution of the sub-ADC 216. For example, in a condition that the resolution of the sub-ADC 216 is 5 bits, the gain of the amplifier 122 is set to be 16 (i.e., $2^{(5-1)}$). The above values of the resolution of the sub-ADC 216 and the gain of the amplifier 122 are given for illustrative purposes only. Various values of these parameters are within the contemplated scope of the present disclosure.

The SAR sub-ADC 124A, the amplifier 124B, the SAR sub-ADC 124C, and the correction logic circuit 124D correspond to the pipelined ADC 124 in FIG. 1. The SAR sub-ADC 124A is configured to convert the amplified residual signal SE3 to a quantized signal S1out(z), and to generate a corresponding residual signal SE4. In some embodiments, the SAR sub-ADC 124A and the amplifier 124B together operate as a first stage of the MDACs for the conversion stage 120. In some embodiments, the circuit arrangements and the operations in the sub-ADC 216 and the amplifier 122 are similar with the MDACs for the conversion stage 120. In other words, the circuit arrangements and the operations of the SAR sub-ADC 124A and the amplifier 124B are similar with those of the sub-ADC 216 and the amplifier 122, and thus the repetitious descriptions are not given here.

The SAR sub-ADC 124C is coupled to the amplifier 124B to receive the amplified residual signal SE4, in order to process the rest residual signal. In some embodiments, the SAR sub-ADC 124C operates as a second stage of the MDACs for the conversion stage 120. The SAR sub-ADC 124C is configured to convert the amplified residual signal SE4 to a quantized signal S2out(z). The correction logic circuit 124D is coupled to the SAR sub-ADC 124A to receive the quantized signal S1out(z), and is coupled to the SAR sub-ADC 124C to receive the quantized signal S2out(z). The correction logic circuit 124D is configured to perform a digital signal processing based on the quantized signals S1out(z) and S2out(z), in order to generate a quantized signal FSout'(z). In some embodiments, the digital signal processing is performed to correct data errors present in the quantized signals S1out(z) and S2out(z). Effectively, with the correction logic circuit 124D, the quantized signals S1out(z) and S2out(z) are combined and filtered to generate the quantized signal FSout'(z).

In some embodiments, the correction logic circuit 124D is implemented with encoders. In some embodiments, the correction logic circuit 124D is implemented with shift registers and/or adders. The above implementations of the correction logic circuit 124D are given for illustrative purposes only. Various circuits to implement the correction logic circuit 124D are within the contemplated scope of the present disclosure.

The differentiator 126 corresponds to the filter circuit 126 in FIG. 1. The differentiator 126 is coupled to the correction logic circuit 124D to receive the quantized signal FSout'(z). In some embodiments, the differentiator 126 is configured to differentiate the quantized signal FSout'(z) to generate a corrected quantized signal CSout(z). In some embodiments, the differentiator 126 is configured to provide a digital transfer function that cancels out the integrators 114A and 114B, in order to provide a simpler circuit structure for combining the quantized signal FSout'(z) with the delayed quantized signal DFout(z).

In some embodiments, the differentiator 126 is implemented with various digital circuits, which include, for example, adders, latches, logical gate, etc. The above implementation of the differentiator 126 is given for illustrative purposes only. Various circuits to implement the differentiator 126 are within the contemplated scope of the present disclosure.

The delay circuit 130 and the filter circuit 140 in FIG. 2 are the same as those circuits in FIG. 1, and thus the repetitious descriptions are not given herein. Moreover, the resolutions of the signals and/or the circuits shown in FIG. 2 are given for illustrative purposes only. Various values of the resolutions of the signals and/or the circuits shown in FIG. 3 are within the contemplated scope of the present disclosure.

Reference is now made to FIG. 0.3. FIG. 3 is a circuit diagram of the conversion stage 110 in FIG. 2, in accordance with some embodiments of the present disclosure. For ease of understanding, like elements in FIG. 3 are designated with the same reference numbers with respect to FIG. 2.

As described above, the DEM circuit 217 is configured to dynamically rearrange interconnections of components in the integrators 114A and 114B and/or the sub-DACs 118A and 118B. In the example of FIG. 3, the DEM circuit 217 is configured to dynamically rearrange interconnections of components in the integrators 114A and 114B. As shown in FIG. 3, each of the integrators 114A and 114B includes capacitors Ci, Cf, and Cd, switches that are controlled by control signals $\Phi 1$, $\Phi 1d$, $\Phi 2$, $\Phi d2$, and $\Phi 21$-$\Phi 24$, and an amplifier A1. The interconnections between the capacitors and the amplifier A1 are determined by the switches. In some embodiments, voltages VRP and VRN are predetermined voltage, which are, for example, the reference voltages that set the voltage range of input signal Vi+ and Vi−. The DEM circuit 217 is configured to generate the control signals $\Phi 21$-$\Phi 24$ based on the quantized signal Fout(z), in order to turn on and off the switches. Accordingly, the interconnections of the integrators 114A and 114B can be dynamically rearranged to reduce the mismatches between the capacitors Ci and Cf.

Figure 3:
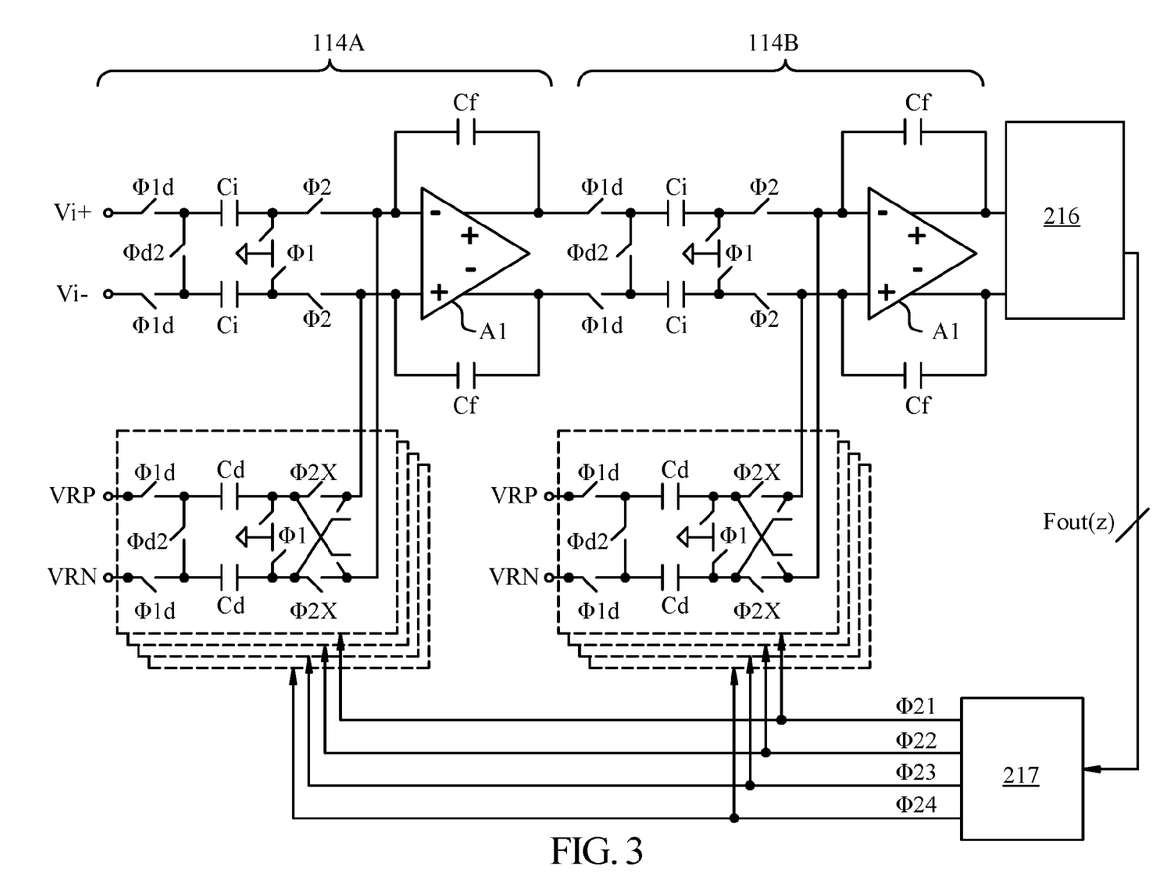
FIG. 3 is a circuit diagram of the conversion stage in FIG. 2, in accordance with some embodiments of the present disclosure.

For ease of understanding, the example in FIG. 3 are illustrated with a fully differential circuit architecture, in which input signals Vi+ and Vi− are differential input signals that correspond to the input signal VIN in FIGS. 1 and 2. The above example of the conversion stage 110 in FIG. 3 is given for illustrative purposes only. Various configurations of the conversion stage 110 are within the contemplated scope of the present disclosure. For example, as discussed above, in some other embodiments, the sub-DACs 118A and 118B are also able to cooperate with the DEM circuit 217 to improve the performance.

Figure 4:
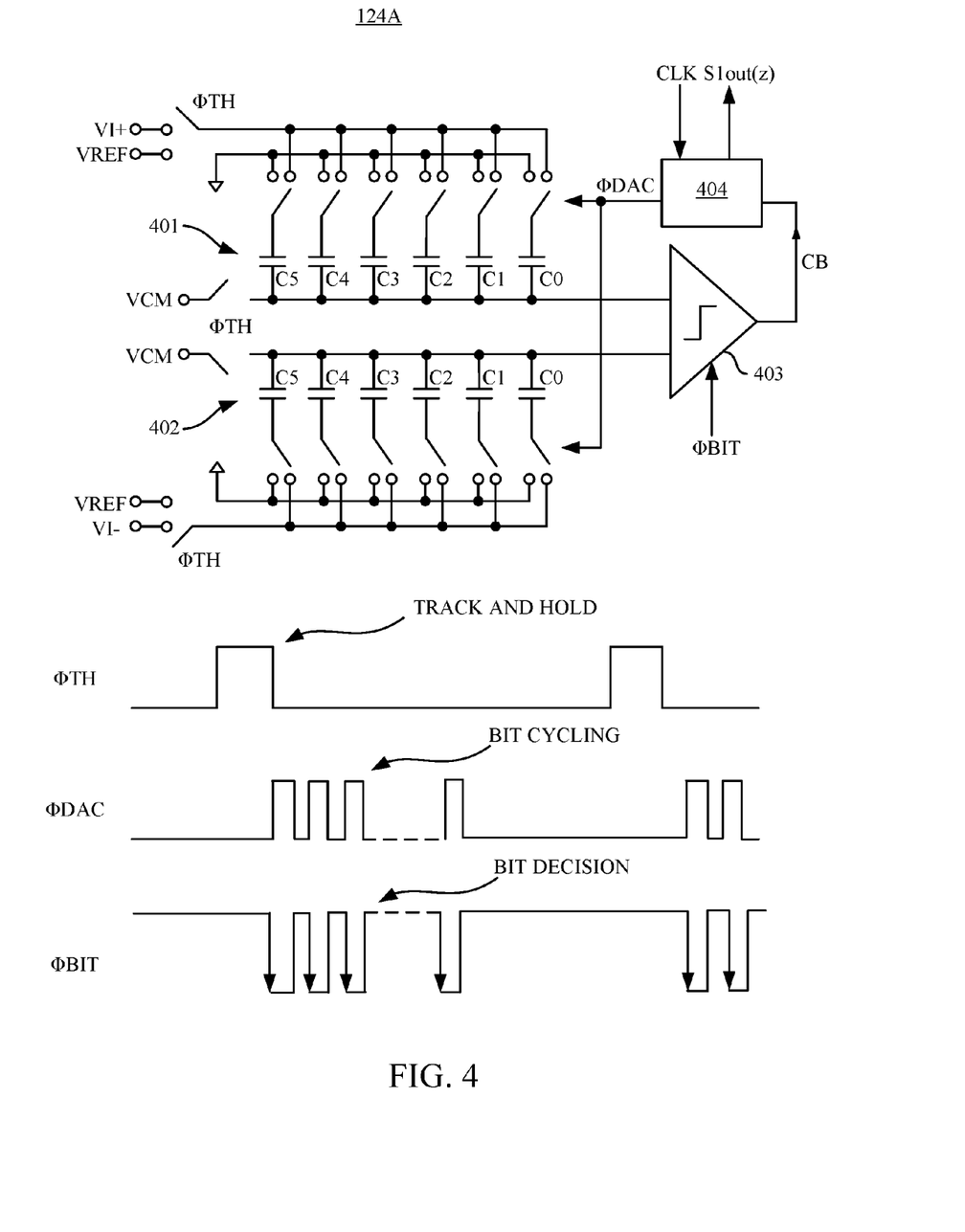
FIG. 4 is a circuit diagram of the SAR sub-ADC in FIG. 2, in accordance with some embodiments of the present disclosure.

Reference is now made to FIG. 4. FIG. 4 is a circuit diagram of the SAR sub-ADC 124A in FIG. 2, in accordance with some embodiments of the present disclosure. For ease of understanding, like elements in FIG. 4 are designated with the same reference numbers with respect to FIG. 2.

In the example of FIG. 4, the SAR sub-ADC 124A includes capacitor arrays 401 and 402, sampling switches that controlled by a sample signal $\Phi TH$, a comparator 403, and a SAR logic circuit 404. Each of the capacitor arrays 401 and 402 includes capacitors C0-C5 and array switches that are controlled by a control signal $\Phi DAC$. The capacitors C0-C5 in the capacitor array 401 are coupled to a first input terminal of the comparator 403, and the capacitors C0-C5 in the capacitor array 402 are coupled to a second input terminal of the comparator 403. Two of the sampling switches are switched according to the sample signal $\Phi TH$, in order to receive one of a reference voltage VREF and the input signal VI+ or VI−. Another two of the sampling switches are switched according to the sample signal $\Phi TH$, in order to transmit a common mode voltage VCM to input terminals of the comparator 403. The array switches are switched according to the control signal $\Phi DAC$, in order to couple the capacitors C0-C5 to one of the sampling switches. The comparator 403 is configured to compare voltages on its input terminals with each other according to a control signal $\Phi BIT$, in order to generate a control bit CB to the SAR logic circuit 404. The SAR logic circuit 404 then generates the quantized signal S1out(z) and the control signal $\Phi DAC$ according to the control bit CB and a clock signal CLK.

In some embodiments, the conversion process of the SAR sub-ADC 124A is associated with a charge redistribution process. In some embodiments, the charge redistribution process includes three phases, which include, for example, a track-and-hold phase, a bit cycling phase, and a bit decision phase. In some embodiments, the three phases are controlled by the sample signal $\Phi TH$ and the control signals $\Phi DAC$ and $\Phi BIT$ in FIG. 4, respectively.

The above arrangements of the SAR sub-ADC 124A are given for illustrative purposes only. Various arrangements of the SAR sub-ADC 124A are within the contemplated scope of the present disclosure.

As discussed above, in some embodiments, main circuits in the electronic devices 100 and 200 in FIGS. 1-2 are able to be implemented with switched capacitor circuits, which include, for example, the conversion stage 110 in FIG. 2 and SAR sub-ADC 124A in FIG. 4. In some embodiments, the rest circuits in the electronic devices 100 and 200 in FIGS. 1-2 are able to be implemented with various digital circuits. Accordingly, the electronic devices 100 and 200 in FIGS. 1-2 can be suitable for being implemented in advanced process technology.

Figure 5:
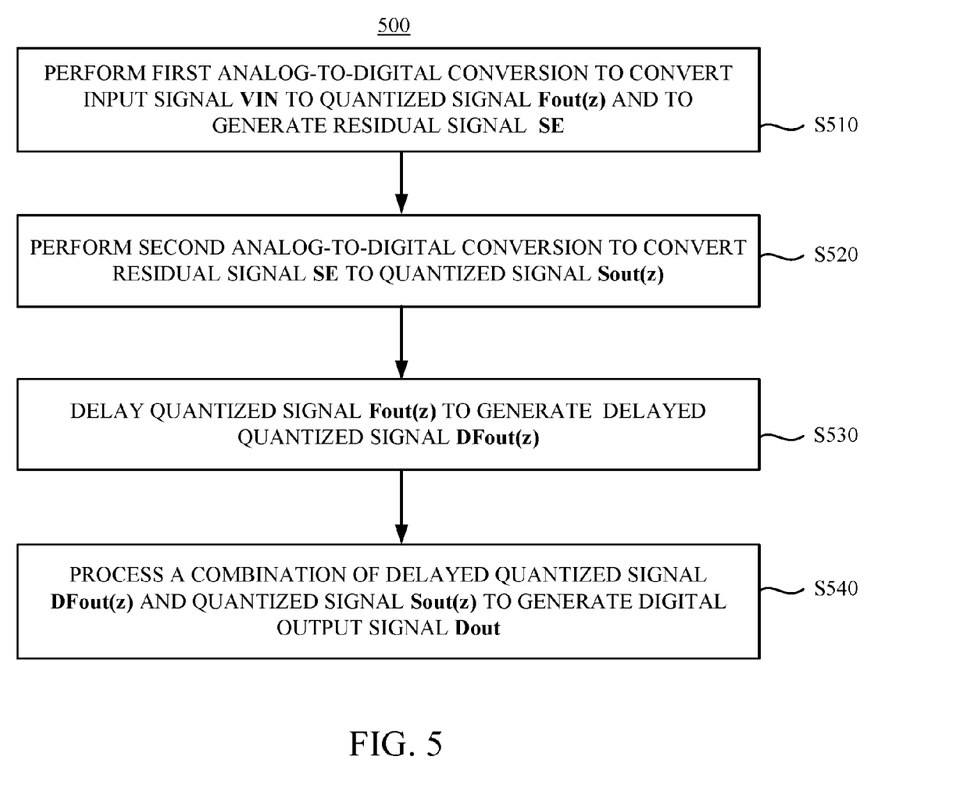
FIG. 5 is a flow chart illustrating operations of a method, in accordance with some embodiments of the present disclosure.

Reference is now made to FIG. 5. FIG. 5 is a flow chart illustrating operations of a method 500, in accordance with some embodiments of the present disclosure.

In operation S510, a first analog-to-digital conversion is performed to convert the input signal VIN to a quantized signal Fout(z) and to generate a residual signal SE. For illustration, as shown in FIG. 1, the first analog-to-digital conversion is performed by the conversion stage 110. As described above, the conversion stage 110 operates as a Delta-Sigma ADC to convert the input signal VIN to a quantized signal Fout(z). In some embodiments, the residual signal SE is the same as the quantized error generated from the conversion process of the conversion stage 110.

In operation S520, a second analog-to-digital conversion is performed to convert the residual signal SE to the quantized signal Sout(z). For illustration, as shown in FIG. 1, the second analog-to-digital conversion is performed by the conversion stage 120. As described above, the conversion stage 120 operates as a pipelined SAR ADC to convert the residual signal SE to the quantized signal Sout(z).

In operation S530, the quantized signal Fout(z) is delayed to generate the delayed quantized signal DFout(z). For illustration, as shown in FIG. 1, the delay circuit 130 delays the quantized signal Fout(z) for the predetermined time, in order to align the data of the quantized signal Fout(z) with the quantized signal Sout(z).

In operation S540, a combination of the delayed quantized signal DFout(z) and the quantized signal Sout(z) is processed to generate the digital output signal Dout. For illustration, as shown in FIG. 1, the combination of the delayed quantized signal DFout(z) and the quantized signal Sout(z) are sequentially processed by the digital filter 126B and the filter circuit 140, in order to generate the digital output signal Dout.

The above illustrations include exemplary operations, but the operations are not necessarily performed in the order shown. Operations can be added, replaced, changed order, and/or eliminated as appropriate, in accordance with the spirit and scope of various embodiments of the present disclosure.

As discussed above, the system and the method disclosed in the present disclosure utilize hybrid analog-to-digital operations to convert signals to digital data. As a result, a high resolution and a high bandwidth can be achieved while having low power consumption.

In this document, the term "coupled" may also be termed as "electrically coupled," and the term "connected" may be termed as "electrically connected". "Coupled" and "connected" may also be used to indicate that two or more elements cooperate or interact with each other.

In some embodiments, a device includes a first conversion stage, a second conversion stage, and a first filter circuit. The first conversion stage is configured to perform a Delta-Sigma modulation based on an input signal, in order to generate a first quantized signal and a first residual signal. The second conversion stage is configured to perform a pipelined successive approximation algorithm in response to the first residual signal, in order to generate a second quantized signal. The first filter circuit is configured to perform a decimation process based on the first quantized signal and the second quantized signal to generate a digital output signal.

In some embodiments, a device includes a Delta-Sigma ADC, a conversion stage, and a first filter circuit. The Delta-Sigma ADC is configured to perform a first analog-to-digital conversion based on an input signal, in order to generate a first quantized signal and a first residual signal. The conversion stage includes a pipelined ADC that is configured to perform a second analog-to-digital conversion based on the first residual signal, in order to generate a second quantized signal. The first filter circuit configured to process the first quantized signal and the second quantized signal to generate a digital output signal.

In some embodiments, a method includes following operations. A first analog-to-digital conversion is performed based on a first input signal, in order to generate a first quantized signal and a first residual signal. A second analog-to-digital conversion is performed based on the first residual signal, in order to generate a second quantized signal, in which the first analog-to-digital conversion is different from the second analog-to-digital conversion. The first quantized signal and the second quantized signal are processed to generate a digital output signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a first conversion stage configured to perform a Delta-Sigma modulation based on an input signal, in order to generate a first quantized signal and a first residual signal;
   a second conversion stage configured to perform a pipelined successive approximation algorithm in response to the first residual signal, in order to generate a second quantized signal, wherein the second conversion stage is further configured to subtract a delayed quantized signal from the second quantized signal, in order to generate a corrected quantized signal, wherein the delayed quantized signal is generated by delaying the first quantized signal; and
   a first filter circuit configured to perform a decimation process based on the first quantized signal and the second quantized signal to generate a digital output signal.

2. The device of claim 1, wherein the first conversion stage is configured to operate as a Delta-Sigma analog-to-digital converter (ADC).

3. The device of claim 1, wherein the second conversion stage is configured to operate as a pipelined successive approximation register (SAR) ADC.

4. The device of claim 1, wherein the first conversion stage comprises:
   a loop filter configured to generate the first residual signal in response to a subtracted signal, wherein the subtracted signal indicates a difference between the input signal and a feedback signal;

a sub-analog-to-digital converter (ADC) configured to generate the first quantized signal in response to the first residual signal; and a sub-digital-to-analog converter (DAC) configured to generate the feedback signal in response to the first quantized signal.

5. The device of claim 4, wherein the sub-ADC is implemented with a SAR ADC.

6. The device of claim 4, wherein the first conversion stage further comprises:

a calculation circuit configured to subtract the feedback signal from the input signal, to generate the subtracted signal.

7. The device of claim 1, wherein the second conversion stage comprises:

an amplifier configured to amplify the first residual signal;
a pipelined ADC configured to convert the amplified first residual signal into the second quantized signal; and
a second filter circuit configured to filter the second quantized signal, to generate the corrected quantized signal.

8. The device of claim 7, wherein the second filter circuit comprises:

a first calculation circuit configured to subtract the delayed quantized signal from the second quantized signal, in order to generate a third quantized signal; and
a digital filter configured to correct the third quantized signal to generate the corrected quantized signal.

9. The device of claim 8, further comprising:

a delay circuit configured to delay the first quantized signal for a predetermined time to generate the delayed quantized signal, wherein the predetermined time is a processing time associated with the second conversion stage.

10. The device of claim 8, wherein the first filter circuit comprises:

a second calculation circuit configured to add the delayed quantized signal and the corrected quantized signal to generate a fourth quantized signal; and
a decimation filter configured to perform the decimation process on the fourth quantized signal to generate the digital output signal.

11. The device of claim 8, wherein the first conversion stage is configured to operate as a Delta-Sigma ADC, and a transfer function of the digital filter is configured to be the same as a noise transfer function of the first conversion stage.

12. A device, comprising:

a Delta-Sigma ADC configured to perform a first analog-to-digital conversion based on an input signal, in order to generate a first quantized signal and a first residual signal;
a conversion stage comprising a pipelined ADC, wherein the pipelined ADC is configured to perform a second analog-to-digital conversion based on the first residual signal, in order to generate a plurality of second quantized signals, wherein the conversion stage is further configured to perform a differentiation based on the second quantized signals to generate a corrected quantized signal, and the differentiation is associated with the Delta-Sigma ADC; and a first filter circuit configured to process the first quantized signal and the second quantized signals to generate a digital output signal.

13. The device of claim 12, wherein the pipelined ADC comprises:

a plurality of SAR sub-ADCs configured to generate the second quantized signals based on the first residual signal; and
a correction logic circuit configured to correct data errors present in the second quantized signals, in order to generate a third quantized signal.

14. The device of claim 13, wherein the conversion stage further comprises a differentiator configured to differentiate the third quantized signal to generate the corrected quantized signal, and a transfer function of the differentiator is configured to be the same as a noise transfer function of the Delta-Sigma ADC.

15. The device of claim 13, wherein the conversion stage further comprises:

an amplifier to amplify the first residual signal,
wherein the SAR sub-ADCs are configured to generate the second quantized signals in response to the amplified first residual signal.

16. The device of claim 12, further comprising:

a delay circuit configured to delay the first quantized signal for a predetermined time to generate a delayed quantized signal, wherein the predetermined time is a processing time associated with the conversion stage.

17. The device of claim 16, wherein the first filter circuit comprises:

a calculation circuit configured to add the delayed quantized signal and the corrected quantized signal to generate a fourth quantized signal; and
a decimation filter configured to perform a decimation process on the fourth quantized signal to generate the digital output signal.

18. A method, comprising:

performing a first analog-to-digital conversion based on a first input signal, in order to generate a first quantized signal and a first residual signal;
performing a second analog-to-digital conversion based on the first residual signal, in order to generate a second quantized signal, wherein the first analog-to-digital conversion is different from the second analog-to-digital conversion;
subtracting a delayed quantized signal from the second quantized signal, in order to generate a corrected quantized signal, wherein the delayed quantized signal is generated by delaying the first quantized signal; and
processing the first quantized signal and the delayed quantized signal to generate a digital output signal.

19. The method of claim 18, wherein the first analog-to-digital conversion is performed by a Delta-Sigma ADC, and the second analog-to-digital conversion is performed by a pipelined SAR ADC.

20. The method of claim 18, wherein the processing the first quantized signal and the delayed quantized signal comprises:

delaying the first quantized signal to generate a delayed quantized signal; and
processing, by a decimator, the delayed quantized signal and the delayed quantized signal to generate the digital output signal.

* * * * *